United States Patent
Asaba

(10) Patent No.: US 11,056,159 B2
(45) Date of Patent: Jul. 6, 2021

(54) DATA ACQUISITION METHOD AND DATA ACQUISITION APPARATUS

(71) Applicant: OMRON Corporation, Kyoto (JP)

(72) Inventor: Kotaro Asaba, Kusatsu (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/645,503

(22) PCT Filed: Oct. 10, 2018

(86) PCT No.: PCT/JP2018/037789
§ 371 (c)(1),
(2) Date: Mar. 9, 2020

(87) PCT Pub. No.: WO2019/082659
PCT Pub. Date: May 2, 2019

(65) Prior Publication Data
US 2020/0279592 A1    Sep. 3, 2020

(30) Foreign Application Priority Data
Oct. 26, 2017  (JP) .............................. JP2017-207337

(51) Int. Cl.
*G06F 13/24* (2006.01)
*G11C 7/10* (2006.01)

(52) U.S. Cl.
CPC ............ *G11C 7/1087* (2013.01); *G06F 13/24* (2013.01); *G11C 7/1072* (2013.01); *G11C 7/1093* (2013.01)

(58) Field of Classification Search
CPC .................................................. G11C 7/1072
See application file for complete search history.

(56) References Cited

U.S. PATENT DOCUMENTS

2002/0002648 A1* 1/2002 Kawase ................... G06F 13/26
710/260
2012/0271576 A1* 10/2012 Kamel ...................... H02J 3/00
702/62

(Continued)

FOREIGN PATENT DOCUMENTS

| JP | S61-088356 A | 5/1986 |
| JP | S61-110242 A | 5/1986 |
| JP | S63-254535 A | 10/1988 |

(Continued)

OTHER PUBLICATIONS

English translation of the International Search Report("ISR") of PCT/JP2018/037789 dated Nov. 27, 2018.

(Continued)

*Primary Examiner* — Min Huang
(74) *Attorney, Agent, or Firm* — Metrolex IP Law Group, PLLC

(57) ABSTRACT

A data acquisition method of acquiring and latching data with a timing based on an input signal supplied to an input port, the method including: acquiring and retaining the data with a timing of when an edge of the input signal is detected, and starting a timer; and at the time of expiration of the timer, if the level of the input signal is a first level that is unchanged from start of the timer, latching the retained data and if the level of the input signal is a second level that is changed from the start of the timer, discarding the retained data.

7 Claims, 4 Drawing Sheets

(56) References Cited

U.S. PATENT DOCUMENTS

2013/0304999 A1* 11/2013 Imai .................... G06F 13/4291
     711/154
2014/0175294 A1* 6/2014 Frach ................... G01T 1/2018
     250/363.03

FOREIGN PATENT DOCUMENTS

| JP | H01-296838 A | 11/1989 |
| JP | H02-288722 A | 11/1990 |
| JP | H05-094620 A | 4/1993 |
| JP | H06-083643 A | 3/1994 |
| JP | 2002-153082 A | 5/2002 |
| JP | 2006-018331 A | 1/2006 |
| JP | 2008-047990 A | 2/2008 |
| JP | 2008-197752 A | 8/2008 |
| JP | 2012-042678 A | 3/2012 |
| JP | 2016-182371 A | 10/2016 |

OTHER PUBLICATIONS

English translation of the Written Opinion("WO") of PCT/JP2018/037789 dated Nov. 27, 2018.

* cited by examiner (A)

(B)

(C)

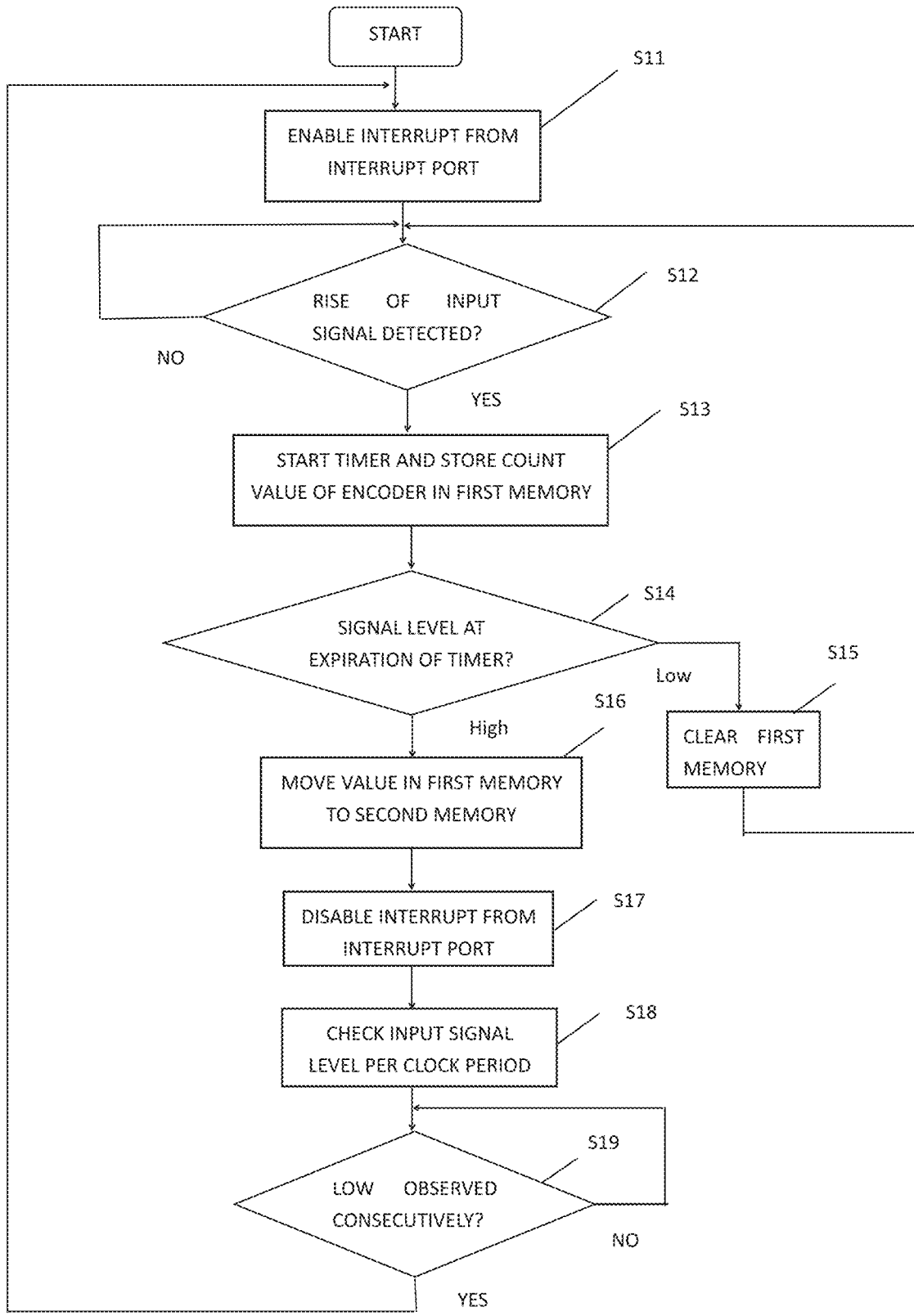

DATA ACQUISITION METHOD AND DATA ACQUISITION APPARATUS

TECHNICAL FIELD

The present invention relates to a data acquisition method.

BACKGROUND ART

In a control system, reading signals and data and temporarily retaining them is called latching. In an apparatus that latches an input signal, noise control is important. This is because if the level of a signal temporarily fluctuates due to superposition of noise, it may be determined that the signal has changed even if the target signal has not changed, and erroneous information may be read.

Regarding a related technique, Patent document 1, for example, discloses a method in which a signal level is determined at a constant cycle, and an interrupt process is performed only when the signal levels of the past two times are the same and the latest signal levels are different. With such a method, noise is controlled because if the signal level changes in a short time, the change can be ignored.

CITATION LIST

Patent Literature

PTL 1: Japanese Patent Laid-Open No. H5-94620

SUMMARY OF THE INVENTION

Technical Problem

According to the method described in Patent document 1, the signal level is periodically acquired and stored, and the comparison is then performed. This method, however, has a problem in that the comparison with a past signal level is performed after the occurrence of an interrupt and an interrupt process is started after an interrupt is determined to be appropriate, which delays the process. For example, in the case where a value output from an encoder is acquired in real time, occurrence of a delay may hinder acquisition of a value with intended timing.

An object of the present invention, which has been made in consideration of the aforementioned problems, is to accurately remove the influence of noise in an apparatus that latches acquired data.

Solution to Problem

A data acquisition method according to the present invention acquires and latches data with a timing based on an input signal supplied to an input port.

To be specific, the method is characterized by including: acquiring and retaining the data with a timing of when an edge of the input signal is detected, and starting a timer; and at the time of expiration of the timer, if the level of the input signal is a first level that is unchanged from start of the timer, latching the retained data and if the level of the input signal is a second level that is changed from the start of the timer, discarding the retained data.

The present invention relates to a method of acquiring data by using an edge of an input signal as a trigger, and latching (retaining) the data. The data acquisition method according to the present invention is characterized by the fact that upon detection of an edge of an input signal, data is acquired and temporarily retained and a timer is started. The timer is a timer for detecting stabilization of the input signal and expires in a predetermined time from its start. In particular, data is acquired and temporarily retained at a stage before the determination of stabilization of the input signal and after stabilization of the input signal is confirmed, the data is officially latched. This configuration prevents occurrence of a time lag even when time is required for determining stabilization of the input signal.

The input port may be an interrupt input port, and an interrupt from the input port may be prohibited at the time of latching the data.

In the case where data is latched using an interrupt as a trigger, for example, if a signal that has once risen temporarily falls to Low due to noise, an interrupt occurs when the signal rises again, which may cause data acquisition with an unintended timing. For this reason, prohibiting an interrupt upon data latching suppresses occurrence of an interrupt due to noise. Note that an interrupt can be canceled anytime when returning to the original state of the input signal can be accurately determined.

The input signal may be monitored in a period during which an interrupt from the input port is prohibited, and when the detection shows that the level of the input signal is consecutively the second level in a predetermined period, the prohibition of the interrupt may be canceled.

The predetermined period can be set according to a period in which the input signal has returned to the original state and stabilized.

The input port may be a port of a CPU, and the predetermined period may be measured using a system clock of the CPU. The predetermined period may be a period synchronized with the system clock.

As described above, use of a system clock can reduce timers used in a CPU.

Note that the present invention can be specified as a data acquisition method including at least one of the aforementioned means. The present invention can also be specified as a data acquisition apparatus that performs the data acquisition method, or a program that causes a computer to execute the data acquisition method. The aforementioned process and means can be freely combined unless technical inconsistencies arise.

Advantageous Effects of Invention

According to the present invention, the influence of noise can be accurately removed in an apparatus that latches acquired data.

BRIEF DESCRIPTION OF DRAWINGS

FIG. 4 is a flowchart of a data acquisition method performed by a computer.

DESCRIPTION OF EMBODIMENTS (System Configuration)

A preferred embodiment of the present invention will now be described with reference to the accompanying drawings.

Figure 1:
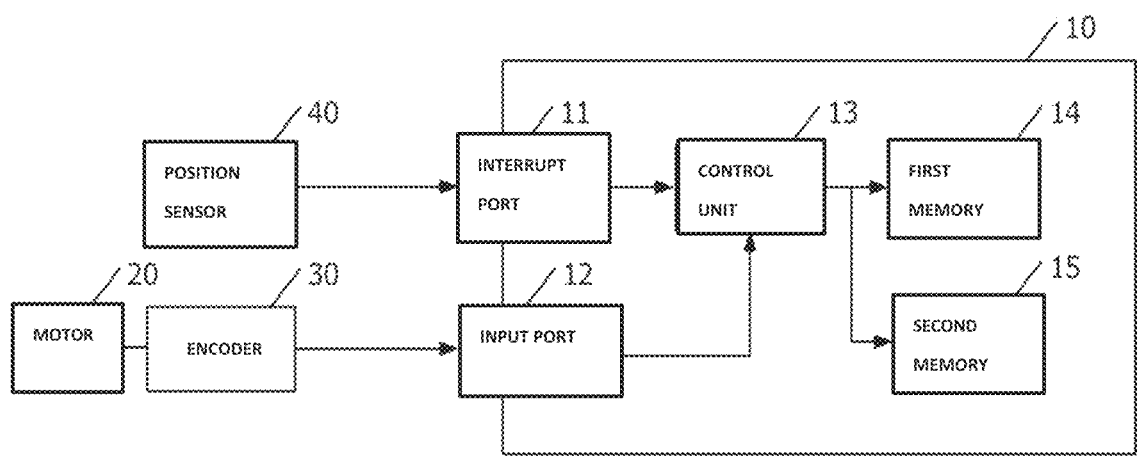
FIG. 1 is a configuration diagram of a control system according to an embodiment.

The control system according to this embodiment is a system that controls a servomotor that drives an object through a computer. FIG. 1 is a configuration diagram of a control system according to a first embodiment.

The control system according to the first embodiment includes a computer 10, a motor 20, an encoder 30, and a position sensor 40.

The motor 20 is a means for driving an object, and is, for example, a servomotor. The shaft of the motor 20 is coupled to the encoder 30, and the encoder 30 outputs position information corresponding to the position (rotation angle) of the motor to the computer 10.

The position sensor 40 is an arbitrary sensor, such as a photoelectric sensor, and is a means for sensing the position of an object. The position sensor 40 is connected to an interrupt port 11 of the computer 10, and transmits an interrupt signal with a predetermined timing. The interrupt signal is transmitted with a timing of when the computer 10 should read data from the encoder 30. The details will be described later.

The computer 10 is a computer that controls the motor 20. To be specific, the rotation angle of the motor 20 is detected based on the position information acquired from the encoder 30, and the motor 20 is controlled.

The computer includes an interrupt port 11, an input port 12, a control unit 13, a first memory 14, and a second memory 15.

The interrupt port 11 is a port for acquisition of a signal supplied from outside (hereinafter, an input signal). In this embodiment, a signal output from the position sensor 40 is supplied to the interrupt port 11, and an interrupt to the control unit 13 described later is handled at a rise of the input signal. In the event of interruption, the control unit 13 acquires position information from the encoder 30.

The input port 12 is a port for acquisition of position information output from the encoder 30. In this embodiment, the input port 12 includes a means for converting position information, which is output from the encoder 30 as an electric signal, into digital information. For example, position information (hereinafter, a count value) in a numerical format is generated by a receiver that receives a pulse signal composed of a plurality of phases or a counter that counts the pulse signal. Such a means is not necessary if the encoder 30 can directly generate data representing the position information.

The acquired count value is latched and used for detecting the position of the motor 20.

The control unit 13 is a means for controlling a process performed by the computer 10. The control unit 13 can be composed of, for example, a processor, such as a CPU or a micro processing unit (MPU), or an arithmetic circuit, such as a field programmable gate array (FPGA) chip. These units may be composed of a single processor or arithmetic circuit, or may be composed of a plurality of processors or arithmetic circuits. The process will be described in detail later.

The first memory 14 and the second memory 15 are means for temporarily storing count values acquired by the input port 12. The first memory 14 and the second memory 15 are composed of a volatile memory, such as a random access memory (RAM), or a non-transitory storage medium, such as a magnetic disk or a flash memory. In this embodiment, the first memory 14 is used as a means for temporarily storing count values acquired from the encoder 30, and the second memory 15 is used as a means for storing latched count values. The position of the motor 20 is controlled according to the count value stored in the second memory 15. The means for controlling the motor 20 by using latched count values is not illustrated in the drawings.

(Overview of Noise Suppression)

Figure 2:
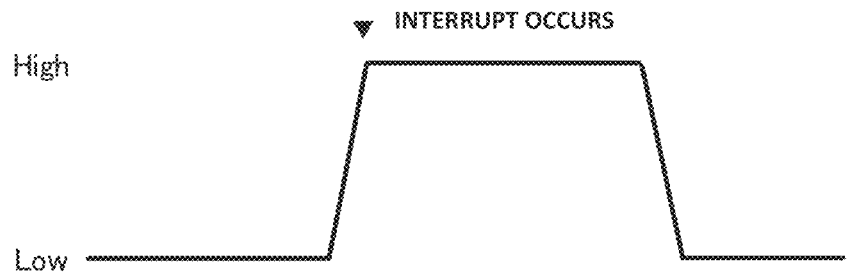
FIG. 2 is a timing chart for explaining a problem to be solved by the present invention.
Figure 2:
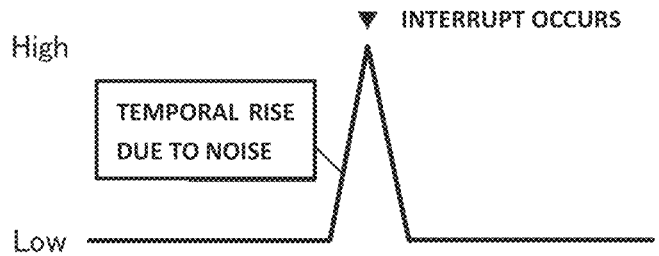
Figure 2:
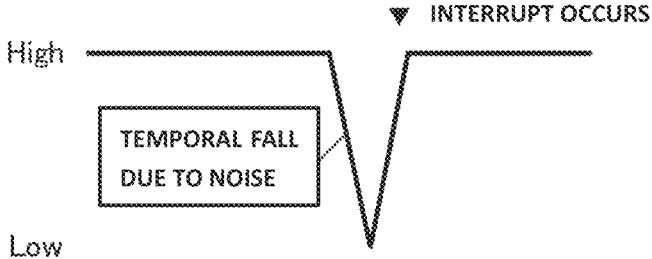

An overview of a method of suppressing noise in a control system according to this embodiment will now be described. FIG. 2 is a diagram illustrating signals input to the interrupt port 11. In this embodiment, as illustrated in FIG. 2(A), an interrupt occurs when the level of the signal input to the interrupt port 11 changes from Low to High, and the control unit 13 that has detected the interrupt acquires a count value from the input port 12 and performs latching.

FIG. 2(B) illustrates an example in which noise is superimposed on a signal input to the interrupt port 11 and the signal level makes a temporal Low to High transition. In this case, as in the case illustrated in FIG. 2(A), a rise of the signal is detected, so that an interrupt occurs and a count value is unintentionally acquired. In other words, the count value is acquired with a timing of when the count value should not be acquired, which causes a malfunction.

FIG. 2(C) illustrates an example in which noise is superimposed on a signal input to the interrupt port 11 and the signal level makes a temporal High to Low transition. In this case also, a rise is detected upon return of the signal level, so that an interrupt occurs and a count value is unintentionally acquired. In other words, the count value is acquired with a timing of when the count value should not be acquired, which causes a malfunction.

One method for solving this problem is to wait for the signal to stabilize without performing the process upon occurrence of an interrupt. For example, if there is a possibility that the signal level fluctuates due to noise or chattering, waiting time continues until a predetermined time elapses (for example, several to several tens of microseconds) after the interrupt occurs, and the signal level is checked again. If no fluctuation has been found, the process proceeds.

In this case, however, the interrupt process cannot be performed until a predetermined time elapses, so that the system speed cannot be increased. For example, when it is applied to a motor control system in which the output of the encoder fluctuates in microseconds, a difference occurs between the timing of when the output should be read and the timing of when the output is actually read, which causes a defect.

Therefore, in the control system according to this embodiment, a count value output from the encoder 30 is acquired and temporarily retained with the timing of occurrence of an interruption, and after it is verified that the level of the input signal is stable, the temporarily retained count value is confirmed.

Figure 3:
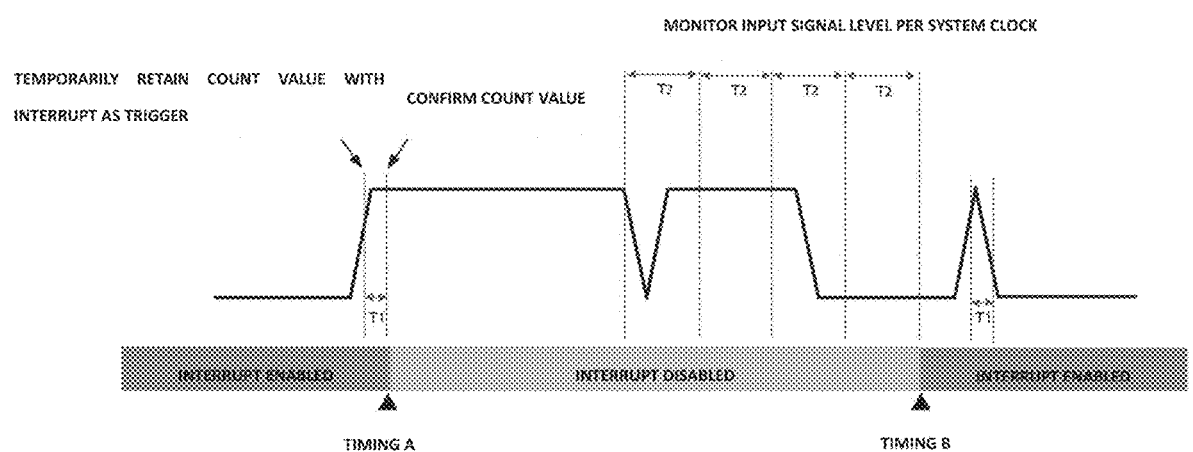
FIG. 3 is a timing chart of an input signal in the embodiment.

FIG. 3 is a diagram illustrating the level of the input signal supplied to the interrupt port 11. In this embodiment, as illustrated in the drawing, in the event of interruption, the control unit 13 acquires the count value with the timing of the interruption and temporarily retains it. Waiting time then starts and continues until a predetermined time T1 elapses, and the signal level is then checked again. Here, if the signal level is High, the temporarily retained count value is confirmed to confirm that the rise of the input signal is not due to noise. If the signal level is Low here, it is determined that the rise is due to noise, and the retained value is discarded. With this configuration, the count value can be acquired at the moment of the occurrence of interruption, so that the process can be performed without a time lag.

Meanwhile, as in the case shown in FIG. 2 (C), the input signal that has risen once may fall temporarily to Low due to noise. In such a case, a rise is detected upon return of the signal level, but the signal is stabilized at High, so that a new count value is unintentionally acquired. In particular, the aforementioned process cannot deal with such a case.

For this reason, in the control system according to this embodiment, when the count value is confirmed upon the rise of the input signal, a process of temporarily disabling interrupt from the interrupt port 11 is performed. In the example shown in FIG. 3, with the timing of when the count value is confirmed (timing A), the control unit 13 disables interrupt from the interrupt port 11.

Description will now be given of the timing of enabling interrupt again.

Since an interrupt occurs with the timing of the rise of the input signal, the interrupt can be canceled if it is confirmed that the input signal has stabilized and made a transition to Low. Therefore, the control system according to this embodiment monitors the input signal in predetermined periods T2, and performs a process of enabling an interrupt if low is observed consecutively. In this embodiment, T2 is a period synchronized with the system clock of the computer 10, and interrupt is enabled again with the timing (timing B) of when the input signal has been Low over two periods. Note that the period T2 is counted independently of the period T1.

If the timing of when the interrupt should be enabled (the timing of when the input signal returns to Low) is recognized in advance, the interrupt may be enabled with that timing.

(Process Flowchart)

A flowchart for performing the aforementioned process will now be described. FIG. 4 is a flowchart of a process performed by the control unit 13.

First, in Step S11, an interrupt from the interrupt port 11 is enabled.

Next, In Step S12, the process goes on standby until a rise of the input signal is detected. Since an interrupt occurs when the input signal rises, the process accordingly proceeds to Step S13.

In Step S13, a timer associated with the period T1 is started, and at the same time, data (that is, a count value) is read from the input port 12 and stored in the first memory 14. The process proceeds to Step S14 when the timer has expired.

In Step S14, the level of the input signal observed when the timer has expired is checked. Here, if the signal level is Low, it is determined that the rise detected in Step S12 is due to noise. In this case, the count value stored in the first memory 14 is discarded (Step S15), and the process returns to Step S12.

In contrast, when the level of the input signal at the expiration of the timer is High, it is clear that the input signal is not noise but an appropriate signal, so that the input signal is stored in the first memory 14 and the count value is moved to the second memory 15 (Step S16). Hence, the count value is confirmed and latched for controlling the motor 20.

If the count value is confirmed, the control unit 13 disables interrupt from the interrupt port 11 in Step S17. Subsequently, the level of the input signal is checked with a timing synchronized with the system clock (Step S18). If the input signal is determined to be Low two consecutive times, the process proceeds to Step S11 to enable the interrupt.

With the process described above, in a control system that latches the count value of the encoder triggered by a rise of the input signal, even if the input signal fluctuates due to noise, its influence can be eliminated. In particular, it is possible to deal with both the case where the input signal temporarily makes a Low to High transition due to noise and the case where the input signal temporarily makes a High to Low transition due to noise. Further, it is possible to control noise without generating a time lag.

(Modification)

Note that the description of the embodiment is merely illustration for describing the present invention, and the present invention can be modified or implemented in combination as appropriate without departing from the spirit of the invention.

For example, although the computer that controls the motor has been illustrated in the description of the embodiment, the present invention is applicable to a motor driver, a position detection device, a programmable logic controller (PLC), and the like. Further, the present invention may be implemented as a program for performing the illustrated process, or may be implemented as an apparatus for performing the illustrated process.

Although the example in which the position of the motor is detected (the rotation angle is detected) is taken in the description of the embodiment, the present invention is applicable to a system that controls any unit other than the motor.

Although In the description of the embodiment, the example in which data is latched with a rise of an input signal as a trigger, the logic of the input signal may be inverted. In other words, the present invention may be applied to a system that latches data with a fall of an input signal as a trigger.

REFERENCE SIGNS LIST

10 Computer
11 Interrupt port
12 Input port
13 Control unit
14 First memory
15 Second memory
20 Motor
30 Encoder
40 Position sensor

The invention claimed is:

1. A data acquisition method of acquiring and latching data with a timing based on an input signal supplied to an interrupt input port, the method comprising:
   acquiring through an input port different from the interrupt input port and retaining the data at a timing at which an edge of the input signal is detected, and starting a timer; and
   at an expiration time of the timer, if the level of the input signal is a first level that is unchanged from start of the timer, latching the retained data and if the level of the input signal is a second level that is changed from the start of the timer, discarding the retained data.

2. The data acquisition method according to claim 1, wherein
   an interrupt from the interrupt input port is prohibited at the time of latching the data.

3. The data acquisition method according to claim 2, wherein
   the input signal is monitored in a period during which an interrupt from the interrupt input port is prohibited, and when the detection shows that the level of the input signal is consecutively the second level in a predetermined period, the prohibition of the interrupt is canceled.

4. The data acquisition method according to claim 3, wherein the interrupt input port is a port of a CPU, and the predetermined period is measured using a system clock of the CPU.

5. The data acquisition method according to claim 4, wherein the predetermined period is a period synchronized with the system clock.

6. A non-transitory computer-readable storage medium storing a program that causes a computer to execute the data acquisition method according to claim 1.

7. A data acquisition apparatus that acquires and latches data with a timing based on an input signal supplied to an interrupt input port, wherein the data is acquired through an input port which is different from the interrupt input port and retained at an edge of the input signal being detected, and a timer is started; and at an expiration time of the timer, if the level of the input signal is a first level that is unchanged from start of the timer, the retained data is latched and if the level of the input signal is a second level that is changed from the start of the timer, the retained data is discarded.

\* \* \* \* \*